United States Patent
Yamane et al.

(10) Patent No.: US 10,756,698 B2
(45) Date of Patent: Aug. 25, 2020

(54) ELASTIC WAVE DEVICE

(71) Applicant: Murata Manufacturing Co., Ltd., Nagaokakyo-shi, Kyoto-fu (JP)

(72) Inventors: Takashi Yamane, Nagaokakyo (JP); Tsutomu Takai, Nagaokakyo (JP); Toru Takeshita, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/369,005

(22) Filed: Mar. 29, 2019

(65) Prior Publication Data

US 2019/0305748 A1 Oct. 3, 2019

(30) Foreign Application Priority Data

Mar. 30, 2018 (JP) .................. 2018-066453

(51) Int. Cl.
*H03H 9/05* (2006.01)
*H03H 9/10* (2006.01)
*H03H 9/02* (2006.01)
*H03H 9/64* (2006.01)
*H03H 9/145* (2006.01)
*H03H 9/25* (2006.01)

(52) U.S. Cl.
CPC .... *H03H 9/02897* (2013.01); *H03H 9/02559* (2013.01); *H03H 9/02834* (2013.01); *H03H 9/02866* (2013.01); *H03H 9/059* (2013.01); *H03H 9/0561* (2013.01); *H03H 9/1092* (2013.01); *H03H 9/145* (2013.01); *H03H 9/25* (2013.01); *H03H 9/6489* (2013.01)

(58) Field of Classification Search
CPC ........ H03H 9/05; H03H 9/058; H03H 9/0576; H03H 9/10; H03H 9/1064; H03H 9/1092
USPC ........................................... 333/193
See application file for complete search history.

(56) References Cited

U.S. PATENT DOCUMENTS

| | | | |
|---|---|---|---|
| 2018/0091116 A1* | 3/2018 | Kai | H03H 9/25 |
| 2018/0097502 A1 | 4/2018 | Yamamoto et al. | |
| 2018/0102757 A1* | 4/2018 | Fukushima | H03H 9/02992 |

FOREIGN PATENT DOCUMENTS

| | | | |
|---|---|---|---|
| WO | 2016/208428 A1 | 12/2016 | |
| WO | WO-2016208426 A1 * | 12/2016 | H03H 9/02992 |

* cited by examiner

*Primary Examiner* — Dean O Takaoka
(74) *Attorney, Agent, or Firm* — Keating & Bennett, LLP

(57) ABSTRACT

An elastic wave device includes a multilayer film including a piezoelectric thin film laminated on a support substrate. In a region outside a region in which an IDT electrode is provided, the multilayer film is not disposed. A first insulating layer extends from at least a portion of the region to a region on the piezoelectric thin film. A wiring electrode extends to a region on the first insulating layer from a region on the piezoelectric thin film and to extend to a region on a portion of the first insulating layer located in the region. A support layer including a cavity defining a hollow space is provided on the support substrate. The support layer includes, on the wiring electrode, a portion extending from the region to a region above an inner end of the first insulating layer.

20 Claims, 11 Drawing Sheets

ELASTIC WAVE DEVICE

CROSS REFERENCE TO RELATED APPLICATIONS

This application claims the benefit of priority to Japanese Patent Application No. 2018-066453 filed on Mar. 30, 2018. The entire contents of this application are hereby incorporated herein by reference.

BACKGROUND OF THE INVENTION

1. Field of the Invention

The present invention relates to an elastic wave device in which a multilayer film including a plurality of films including a piezoelectric thin film is provided on a support substrate.

2. Description of the Related Art

Elastic wave devices have been widely used in filters of cellular phones and the like.

As an example of such an elastic wave device, International Publication No. WO 2016/208428 discloses an elastic wave device in which a multilayer film including a plurality of films including a piezoelectric thin film is provided on a support substrate. In this elastic wave device, the multilayer film is not present in a portion of a region outside a region in which an IDT electrode is provided. An insulating layer is provided so as to extend from at least a portion of the region in which the multilayer film is not present to a region on the piezoelectric thin film. Further, a wiring electrode is provided so as to extend to the insulating layer from a region on the piezoelectric thin film and to a region on an insulating layer portion located in the region where the multilayer film is not present.

Since the elastic wave device described in International Publication No. WO 2016/208428 is provided with the above-described configuration, it is considered that the occurrence of cracking or chipping of the piezoelectric thin film is reduced, the occurrence of interfacial peeling in the multilayer film is reduced, and the occurrence of disconnection of the wiring electrode is reduced.

However, in recent years, there has been a demand for an elastic wave device in which the occurrence of disconnection of wiring electrodes is reduced even under severe conditions, such as repetition of a cycle from a low temperature to a high temperature, and higher performance is demanded for an elastic wave device.

SUMMARY OF THE INVENTION

Preferred embodiments of the present invention provide elastic wave devices in each of which the occurrence of disconnection of a wiring electrode is further reduced or prevented, and the reliability thereof is further improved.

An elastic wave device according to a preferred embodiment of the present invention includes a support substrate, a multilayer film provided on or above the support substrate and including a plurality of films including a piezoelectric thin film, an IDT electrode provided on one surface of the piezoelectric thin film, the multilayer film is not disposed in at least a portion of a region outside a region in which the IDT electrode is provided, in plan view, a first insulating layer extending from at least a portion of the region in which the multilayer film is not disposed to a region on the piezoelectric thin film, a wiring electrode electrically connected to the IDT electrode, extending from a region on the piezoelectric thin film to a region on the first insulating layer, and extending to a region on a portion of the first insulating layer located in the region in which the multilayer film is not disposed, and a support layer provided on or above the support substrate and including a cavity defining a hollow space, in which the support layer includes a portion extending from the region in which the multilayer film is not disposed, to a region above an inner end of the first insulating layer located on the piezoelectric thin film, on the wiring electrode.

In an elastic wave device according to a preferred embodiment of the present invention, the support layer includes a portion on the wiring electrode, extending from the region in which the multilayer film is not disposed to a farther inner side than the inner end of the first insulating layer located on the piezoelectric thin film.

In an elastic wave device according to a preferred embodiment of the present invention, the first insulating layer extends from at least a portion of the region in which the multilayer film is not disposed, to a region on the piezoelectric thin film, passing through a side surface of the multilayer film.

In an elastic wave device according to a preferred embodiment of the present invention, an opposite surface of the first insulating layer to a surface on a side of the support substrate includes a first inclined surface inclined such that a distance from the side of the support substrate increases, as a distance increases from the region in which the multilayer film is not disposed toward the region on the piezoelectric thin film.

In an elastic wave device according to a preferred embodiment of the present invention, the first inclined surface of the first insulating layer extends from a region on the support substrate to a region of the first insulating layer on the piezoelectric thin film.

In an elastic wave device according to a preferred embodiment of the present invention, the first insulating layer extends from the first inclined surface to at least a portion of the region in which the multilayer film is not disposed.

In an elastic wave device according to a preferred embodiment of the present invention, a thickness of the first insulating layer in the region in which the multilayer film is not disposed is larger than a thickness of the first insulating layer on the piezoelectric thin film.

In an elastic wave device according to a preferred embodiment of the present invention, an opposite surface of the first insulating layer to a surface on a side of the support substrate includes a second inclined surface inclined such that a distance to the side of the support substrate decreases, as a distance increases from the region where the multilayer film is not disposed toward the region on the piezoelectric thin film.

In an elastic wave device according to a preferred embodiment of the present invention, a second insulating layer provided between the wiring electrode and the support substrate is further included, and the second insulating layer extends to a region on the first insulating layer.

In an elastic wave device according to a preferred embodiment of the present invention, when a direction perpendicular or substantially perpendicular to a direction in which the wiring electrode extends is a width direction, one end and another end of the wiring electrode in the width direction are respectively located, in the width direction, inside one end and another end of the second insulating layer in the width direction.

In an elastic wave device according to a preferred embodiment of the present invention, the multilayer film includes the piezoelectric thin film and a low acoustic velocity film in which an acoustic velocity of a propagating bulk wave is lower than an acoustic velocity of an elastic wave propagating in the piezoelectric thin film, and the piezoelectric thin film is laminated on the low acoustic velocity film.

In an elastic wave device according to a preferred embodiment of the present invention, the multilayer film includes the piezoelectric thin film, a high acoustic velocity film in which an acoustic velocity of a propagating bulk wave is higher than an acoustic velocity of an elastic wave propagating in the piezoelectric thin film, and a low acoustic velocity film laminated on the high acoustic velocity film, in which an acoustic velocity of a propagating bulk wave is lower than an acoustic velocity of an elastic wave propagating in the piezoelectric thin film, and the piezoelectric thin film is laminated on the low acoustic velocity film.

In an elastic wave device according to a preferred embodiment of the present invention, the multilayer film includes the piezoelectric thin film, a high acoustic impedance film having a relatively high acoustic impedance, and a low acoustic impedance film having a lower acoustic impedance compared to the high acoustic impedance film.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to the accompanying drawings, to clarify the present invention.

It should be noted that each of the preferred embodiments described herein is a non-limiting example and that partial replacement or combination of the configurations is possible between different preferred embodiments.

First Preferred Embodiment

Figure 1:
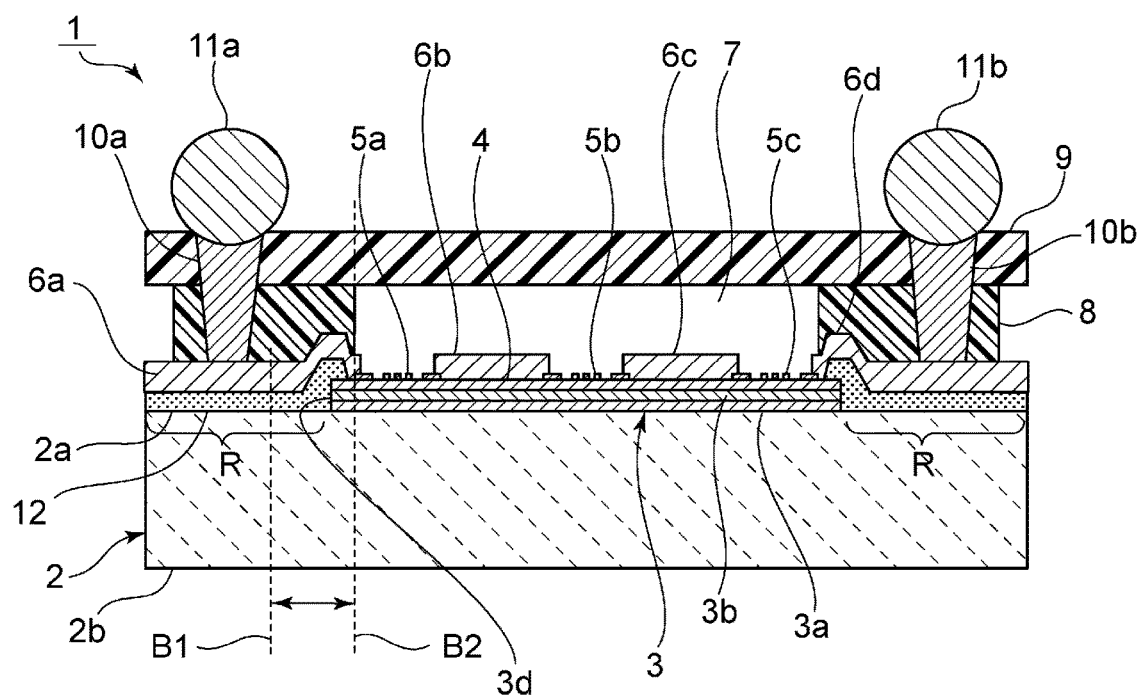
FIG. 1 is a front sectional view of an elastic wave device according to a first preferred embodiment of the present invention.

FIG. 1 is a front sectional view of an elastic wave device according to a first preferred embodiment of the present invention.

An elastic wave device 1 includes a support substrate 2. The support substrate 2 includes a first main surface 2a and a second main surface 2b opposite to each other. A multilayer film 3 is provided on or above the first main surface 2a. The multilayer film 3 includes a high acoustic velocity film 3a, a low acoustic velocity film 3b laminated on the high acoustic velocity film 3a, and a piezoelectric thin film 4 laminated on the low acoustic velocity film 3b. In the multilayer film 3, the piezoelectric thin film 4 is located at an uppermost portion. The high acoustic velocity film 3a is a film in which an acoustic velocity of a propagating bulk wave is higher than an acoustic velocity of an elastic wave propagating in the piezoelectric thin film 4. The low acoustic velocity film 3b is a film in which an acoustic velocity of a propagating bulk wave is lower than an acoustic velocity of an elastic wave propagating in the piezoelectric thin film 4.

Note that, although there is no particular limitation on a material of the piezoelectric thin film 4, any of $LiTaO_3$, $LiNbO_3$, $ZnO$, $AlN$, or PZT, for example, may preferably be used. These may be used alone, or a plurality of these materials may be used in combination. In the present preferred embodiment, the piezoelectric thin film 4 is preferably made of, for example, LiTaO$_3$. However, other piezoelectric single crystals may be used. Note that a film thickness of the piezoelectric thin film 4 is preferably equal to or less than about 1.5λ, for example, where λ is a wave length of an elastic wave determined by an electrode period of an IDT electrode. In this case, by selecting the film thickness of the piezoelectric thin film 4 within a range equal to or less than about 1.5λ, an electromechanical coupling coefficient is able to be more easily adjusted.

The high acoustic velocity film 3a is made of a suitable material satisfying the above acoustic velocity relationship. Examples of such a material include piezoelectric bodies, such as aluminum nitride, aluminum oxide, silicon carbide, silicon nitride, silicon oxynitride, a DLC film, silicon, sapphire, lithium tantalate, lithium niobate, and quartz, a variety of ceramics such as alumina, zirconia, cordierite, mullite, steatite, and forsterite, and magnesia, diamond, and other suitable materials. Further, a material containing the above materials as a main component or a material containing a mixture of the above materials as a main component may be used.

The low acoustic velocity film 3b is made of a suitable material in which an acoustic velocity of a propagating bulk wave is lower than an acoustic velocity of an elastic wave propagating in the piezoelectric thin film 4. Examples of such a material include silicon oxide, glass, silicon oxynitride, tantalum oxide, a compound obtained by adding fluorine, carbon, or boron to silicon oxide, and other suitable materials. Also for the low acoustic velocity film 3b, a material containing the above materials as a main component or a material containing a mixture of the above materials as a main component may be used.

Note that an acoustic velocity of a bulk wave is an acoustic velocity unique to a material, and there are a P wave vibrating in a wave direction that is a vertical direction, and an S wave vibrating in a horizontal direction that is a direction perpendicular or substantially perpendicular to the wave direction. The above bulk wave propagates in any of the piezoelectric thin film 4, the high acoustic velocity film 3a, and the low acoustic velocity film 3b. In a case of an isotropic material, the P wave and the S wave exist. In a case of an anisotropic material, the P wave, a slow S wave, and a fast S wave exist. Additionally, when a surface acoustic wave is excited using an anisotropic material, an SH (Shear Horizontal) wave and an SV (Shear Vertical) wave are generated as two S waves. In this specification, an acoustic velocity of an elastic wave of a main mode propagating in the piezoelectric thin film 4 refers to a mode used to obtain a pass band as a filter and resonance characteristics as a resonator among three modes of the P wave, the SH wave, and the SV wave.

Note that an adhesion layer may be provided between the high acoustic velocity film 3a and the piezoelectric thin film 4. When the adhesion layer is provided, adhesion between the high acoustic velocity film 3a and the piezoelectric thin film 4 is able to be further improved. It is sufficient that the adhesion layer is made of resin or metal, and for example, an epoxy resin or a polyimide resin is preferably used.

Since the high acoustic velocity film 3a and the low acoustic velocity film 3b are laminated on the piezoelectric thin film 4, it is possible to increase a Q value.

Figure 2:
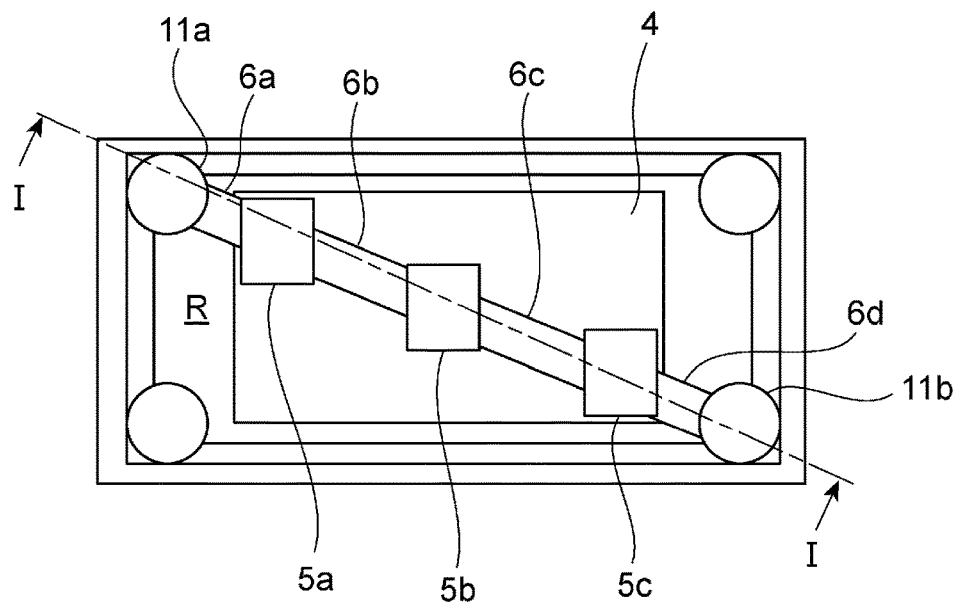
FIG. 2 is a schematic plan view illustrating the elastic wave device according to the first preferred embodiment of the present invention, in which a cover member and a support layer are not illustrated.

On the piezoelectric thin film 4, IDT electrodes 5a to 5c are provided. As illustrated in a plan view in FIG. 2, the IDT electrodes 5a to 5c are electrically connected to each other by wiring electrodes 6a to 6d. Note that, in FIG. 2, a cover member 9 and a support layer 8, described later are seen through, and a lower electrode structure is schematically illustrated. A region in which each of the IDT electrodes 5a to 5c is provided is denoted as a rectangular or substantially rectangular shape. Further, FIG. 1 is a sectional view corresponding to a portion along a line I-I in FIG. 2.

In the present preferred embodiment, respective surface acoustic wave resonators including the plurality of IDT electrodes 5a to 5c are connected to each other, and thus a band pass filter is provided. Note that a filter circuit is not particularly limited.

Referring again to FIG. 1, in the elastic wave device 1, a hollow space 7 to which the IDT electrodes 5a to 5c face is provided. In other words, the support layer 8 including a cavity is provided on or above the support substrate 2. The support layer is preferably made of a synthetic resin, for example. The support layer 8 may also be made of an inorganic insulating material.

The cover member 9 closes the cavity of the support layer 8. The hollow space 7 is sealed by the cover member 9 and the support layer 8.

Through-holes penetrate through the support layer 8 and the cover member 9. Under-bump metal layers 10a and 10b are provided inside the respective through-holes. Metal bumps 11a and 11b are bonded to the respective under-bump metal layers 10a and 10b.

The under-bump metal layers 10a and 10b and the metal bumps 11a and 11b are made of an appropriate metal or alloy.

A lower end of the under-bump metal layer 10a is bonded to the wiring electrode 6a. A lower end of the under-bump metal layer 10b is bonded to a wiring electrode 6d. Accordingly, each of a portion of the wiring electrode 6a to which the under-bump metal layer 10a is bonded, and a portion of the wiring electrode 6d to which the under-bump metal layers 10b is bonded defines and functions as an electrode land portion with which an external connection terminal is connected. In the present preferred embodiment, the metal bumps 11a and 11b are provided as external connection terminals.

On the support substrate 2, the multilayer film 3 is partially not disposed. In other words, on the first main surface 2a of the support substrate 2, a region R in which the multilayer film 3 is not disposed is provided outside a region in which the multilayer film 3 is provided.

In the elastic wave device 1, the electrode land described above is provided in the region R. Accordingly, stress when the metal bumps 11a and 11b, as the external connection terminals, are joined is not directly applied to a portion on which the multilayer film 3 is laminated. Thus, the occurrence of cracking or chipping of the piezoelectric thin film 4 is reduced or prevented. Also, the occurrence of interfacial peeling in the multilayer film 3 is reduced or prevented. The occurrence of cracking or chipping of the piezoelectric thin film, and thus the occurrence of interfacial peeling is reduced or prevented, regardless of the stress when the metal bumps 11a and 11b are provided and the stress when dividing by cutting with a dicing machine is performed.

Figure 3:
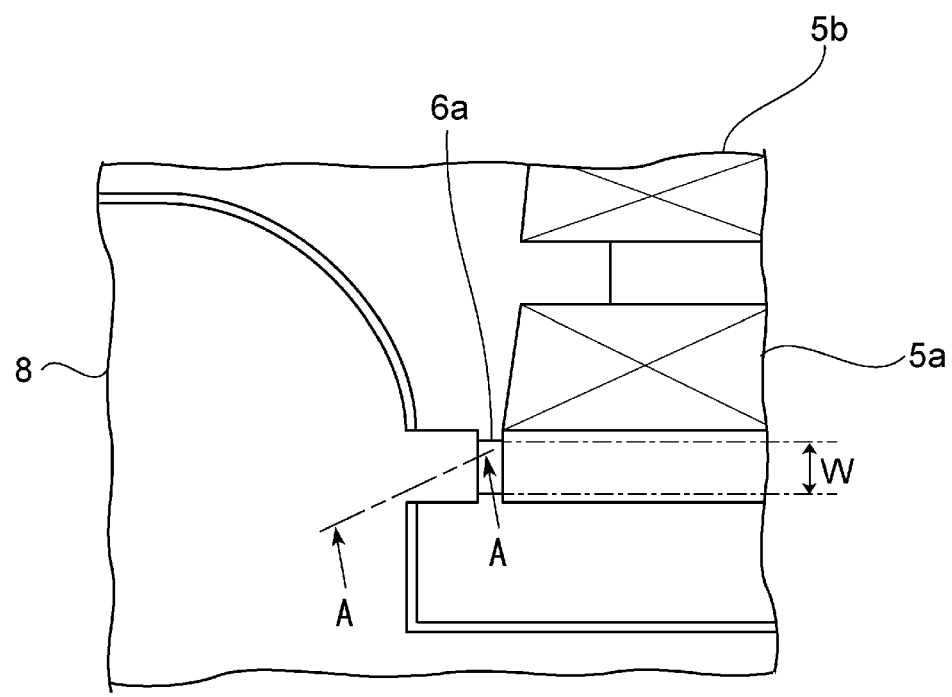
FIG. 3 is a schematic plan view for describing a main portion of the elastic wave device according to the first preferred embodiment of the present invention.
Figure 4A:
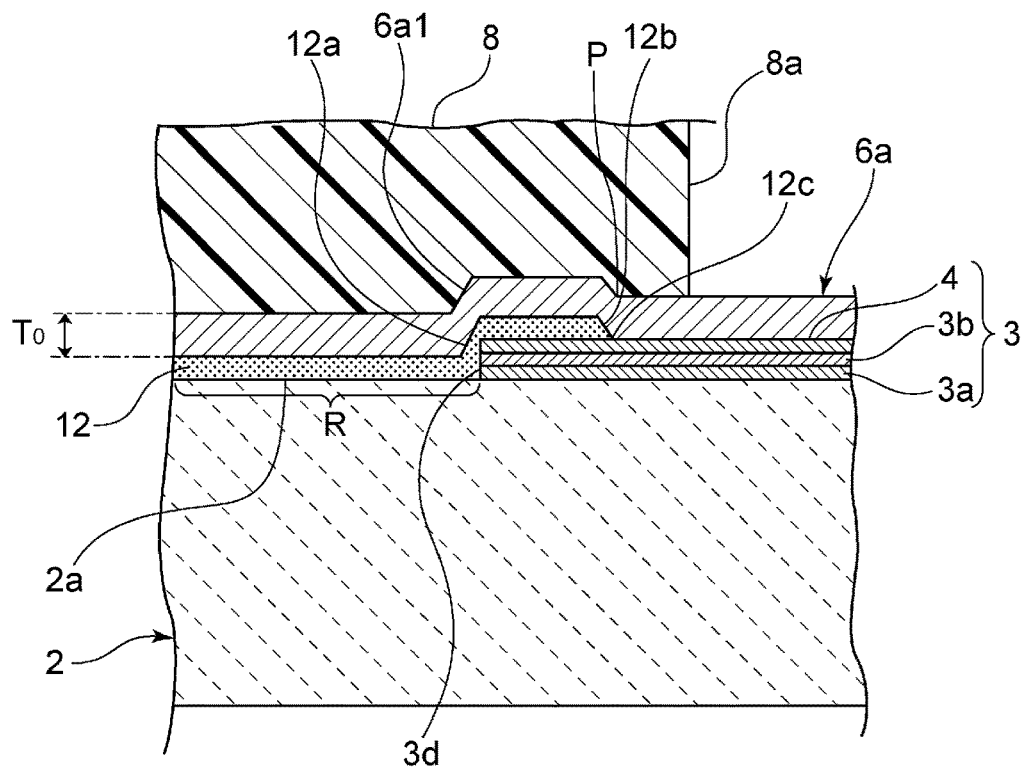
FIG. 4A is a partial cutaway enlarged sectional view of a portion along a line A-A in FIG. 3.
Figure 4B:
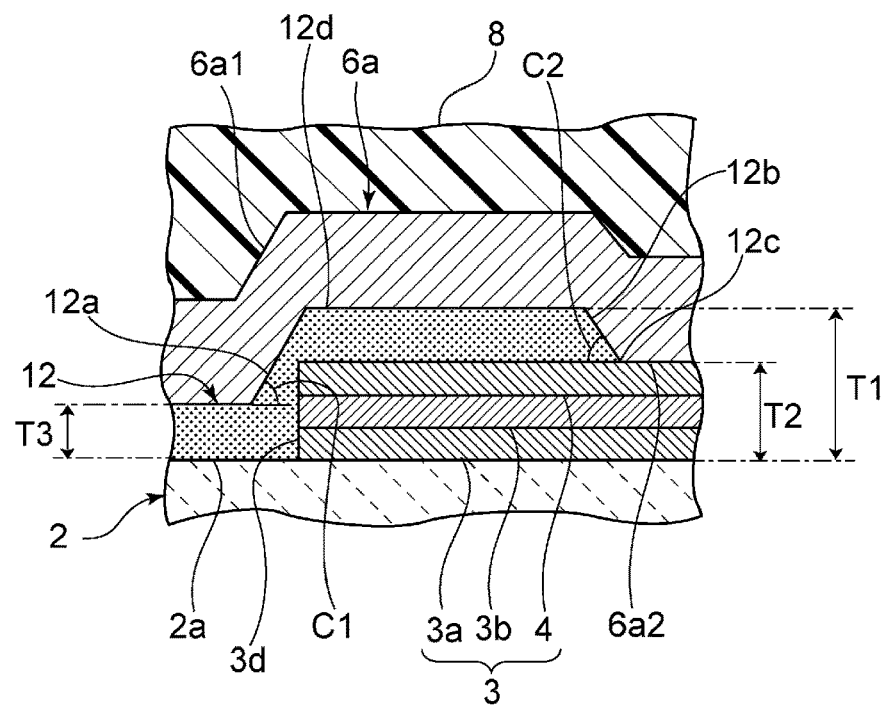
FIG. 4B is a partial cutaway sectional view enlarging and illustrating a main portion of FIG. 4A.

FIG. 3 is a schematic plan view for describing a main portion of the elastic wave device according to the first preferred embodiment of the present invention. In FIG. 3, the cover member 9 described later is seen through, and a portion in which the support layer 8 covers the wiring electrode 6a is illustrated. In addition, a portion in which each of the IDT electrodes 5a and 5b is provided is illustrated by adding a cross to a rectangle. FIG. 4A is a partial cutaway enlarged sectional view of a portion along a line A-A of FIG. 3. Note that the portion along the line A-A in FIG. 3 corresponds to a portion between B1 and B2 in FIG. 1. Further, FIG. 4B is a partial cutaway sectional view enlarging and illustrating a main portion of FIG. 4A.

As illustrated in FIG. 4A, a first insulating layer 12 is provided on the support substrate 2. The first insulating layer 12 passes through a side surface 3d of the multilayer film 3 and extends to an upper surface of the piezoelectric thin film 4.

The first insulating layer 12 is preferably made of a synthetic resin, for example. Examples of such a synthetic resin include polyimide, epoxy, and other suitable materials. Note that the first insulating layer 12 may be made of an inorganic insulating material, and a material of the first insulating layer 12 is not particularly limited. For example, as a material of the first insulating layer 12, an appropriate material such as SOG, $SiO_2$, TEOS, or SiN, for example, may preferably be used.

The wiring electrode 6a extends from a region on the piezoelectric thin film 4 to a region on the first insulating layer 12 and extends to a region on a portion of the first insulating layer located in the region R in which the multilayer film 3 is not disposed.

Further, the support layer 8 further includes, on the wiring electrode 6a, a portion extending from the region R in which the multilayer film 3 is not disposed to a farther inner side than an inner end 12c of the first insulating layer 12 located on the piezoelectric thin film 4. Note that the inner end 12c of the first insulating layer 12 refers to an inner side of the first insulating layer 12, that is, an end portion on a side of the IDT electrodes 5a to 5c. Accordingly, the support layer 8 extends from the region R in which the multilayer film 3 is not disposed, toward the side of the IDT electrodes 5a to 5c, to a region on a portion of the piezoelectric thin film in which the first insulating layer 12 is not provided. In this manner, at least a portion of the support layer 8 is preferably provided so as to cover the inner end 12c of the first insulating layer 12.

A feature of the present preferred embodiment is that, the support layer 8 includes, on the wiring electrode 6a, a portion extending from the region R to the inner side than the inner end 12c of the first insulating layer 12 located on the piezoelectric thin film 4. Accordingly, in the elastic wave device 1, the occurrence of disconnection of the wiring electrode 6a is further reduced or prevented, and the reliability of the elastic wave device 1 is further improved. The reason thereof may be described as follows with reference to FIG. 5.

Figure 5:
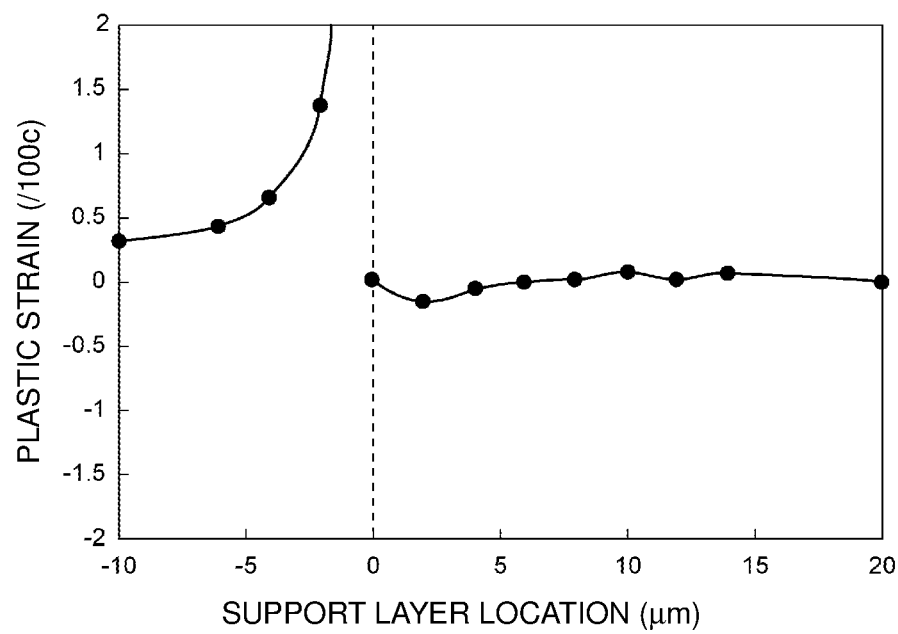
FIG. 5 is a graph illustrating the relationship between a support layer location and a plastic strain in the elastic wave device according to the first preferred embodiment of the present invention.

FIG. 5 is a graph illustrating the relationship between a support layer location and a plastic strain in the elastic wave device 1. Note that the support layer location refers to a location of an inner end 8a of the support layer 8, that is, a location of an end portion on the side of the IDT electrodes 5a to 5c of the support layer 8. When the support layer location is located above the inner end 12c of the first insulating layer 12, and the inner end 8a of the support layer 8 and the inner end 12c of the first insulating layer 12 are at the same or substantially location in plan view, the point of an x-axis of a graph is located at about 0 μm. Additionally, when the support layer location is farther inside than the inner end 12c of the first insulating layer 12, the point of the x-axis of the graph is located in a positive region. On the other hand, when the support layer location is outside the inner end 12c of the first insulating layer 12, the point of the x-axis of the graph is located in a negative region. Note that the plastic strain is a plastic strain of the wiring electrode 6a at about −75° C., for example. Specifically, the plastic strain is a plastic strain at a lower end P of an inclined surface in the wiring electrode 6a illustrated in FIG. 4A. The lower end P of the inclined surface in the wiring electrode 6a is a bent portion of the wiring electrode 6a above the inner end 12c of the first insulating layer 12. The inclined surface in the wiring electrode 6a is inclined toward the multilayer film 3 in a region on the multilayer film 3. Also, a result of the plastic strain is a result of a thermal stress simulation analysis using a finite element method using FEMTET®.

As illustrated in FIG. 5, when the support layer location is located at about 0 μm or more, that is, when the inner end 8a of the support layer 8 is located at the same or substantially the same location as the inner end 12c of the first insulating layer 12 in plan view, or is provided farther inside (IDT electrode side) than the inner end 12c of the first insulating layer 12, it was discovered that the plastic strain is equal or substantially equal to 0. On the other hand, when the support layer location is located at less than about 0 μm, that is, when the inner end 8a of the support layer 8 is provided outside the inner end 12c of the first insulating layer 12 (on a region R side), it was discovered that the plastic strain increases in a positive direction.

Note that, in general, when a plastic strain increases in the positive direction, a tensile stress occurs. This causes disconnection of the wiring electrode 6a in some cases. However, in the present preferred embodiment, the inner end 8a of the support layer 8 is provided farther inside than the inner end 12c of the first insulating layer 12 (IDT electrode side), and the support layer location is preferably located at about 0 μm or more, for example. Thus, the plastic strain is equal or substantially equal to 0, and the occurrence of a tensile stress is reduced or prevented. Thus, the occurrence of disconnection of the wiring electrode 6a is further reduced or prevented.

As described above, in the elastic wave device 1, the occurrence of a tensile stress is reduced or prevented even at a low temperature of about −75° C., for example, and the elastic wave device 1 has excellent thermal shock resistance. Thus, for example, even after about 700 cycles of about −55° C. to about 125° C. are repeated in compliant with JESD47J-01 of JEDEC, the occurrence of failure is reduced or prevented, and the reliability is further improved.

In addition, in the present preferred embodiment, it is sufficient that the inner end 8a of the support layer 8 extends to a region above the inner end 12c of the first insulating layer 12. In this case as well, the occurrence of disconnection of the wiring electrode 6a is able to be further reduced or prevented, and the reliability is able to be further improved. However, from a viewpoint of further ensuring that the occurrence of disconnection of the wiring electrode 6a is reduced or prevented, and a yield of a product is further increased, the inner end 8a of the support layer 8 preferably extends farther inside than the inner end 12c of the first insulating layer 12 as in the elastic wave device 1. In particular, it is more preferable that the inner end 8a of the support layer 8 extends farther inside than the inner end 12c of the first insulating layer 12 by, for example, about 3 μm or more in plan view. In this case, it is possible to further reliably increase a yield of a product. Note that, although there is no particular limitation on an upper limit of a difference in distance between the inner end 8a of the support layer 8 and the inner end 12c of the first insulating layer 12 in plan view, for example, about 20 μm may preferably be used.

In the elastic wave device 1, as illustrated in FIG. 4B, an inclined surface 12a is located on a surface of the first insulating layer 12 opposite to a surface thereof on a side of the support substrate 2, above the side surface 3d of the multilayer film 3. The inclined surface 12a is provided such that a distance to the piezoelectric thin film 4 decreases, that is, a distance from the first main surface 2a of the support substrate 2 increases, as a distance from a region on the region R toward a region on the piezoelectric thin film 4 increases. Thus, an angle defined by an inclined surface 6a1 of the wiring electrode 6a and the first main surface 2a is also reduced. Accordingly, it is possible to reduce a degree of bending at a portion in which the inclined surface 6a1 of the wiring electrode 6a is provided. In other words, it is possible to reduce the influence of a step between the first main surface 2a of the support substrate 2 in the region R outside the side surface 3d, and an upper surface of the piezoelectric thin film 4 by the first insulating layer 12. Thus, the occurrence of disconnection of the wiring electrode 6a is further reduced or prevented.

In addition, in the present preferred embodiment, such an inclined surface 12a is not necessarily provided. However, the inclined surface 12a is preferably provided from a viewpoint of making the disconnection of the wiring electrode 6a further less likely to occur. When the inclined surface 12a is provided, an angle C1 defined by the inclined surface 12a and the first main surface 2a of the support substrate 2 is preferably equal to or less than about 80°, for example.

Also, an inclined surface 12b is preferably provided at the inner end 12c of the first insulating layer 12. An angle C2 defined by the inclined surface 12b and the first main surface 2a is also preferably equal to or less than about 80°, for example. Thus, the disconnection of the wiring electrode 6a above the inclined surface 12b is even more less likely to occur.

Note that, the angle C1 defined by the inclined surface 12a and the first main surface 2a, and the angle C2 defined by the inclined surface 12b and the first main surface 2a are more preferably equal to or less than about 60°, and still more preferably equal to or less than about 45°, for example.

As described above, the degree of bending of the wiring electrode 6a is preferably reduced. Accordingly, the occurrence of disconnection when heat is applied or disconnection in a formation process of the wiring electrode 6a is further reduced or prevented.

In addition, in the elastic wave device 1, the side surface 3d of the multilayer film 3 is covered with the first insulating layer 12. Thus, also the occurrence of interfacial peeling in the multilayer film 3 is further reduced or prevented. However, in preferred embodiments of the present invention, the side surface 3d of the multilayer film 3 is not necessarily covered with the first insulating layer 12.

In the present preferred embodiment, a thickness $T_0$ of the wiring electrode 6a illustrated in FIG. 4A is preferably equal to or more than about 2 μm, for example. In this case, the occurrence of failure, such as disconnection of the wiring electrode 6a, is further reduced or prevented. In addition, the thickness $T_0$ of the wiring electrode 6a is preferably less than about 5 μm, for example. In this case, the occurrence of a formation failure of a resist during manufacturing is further reduced, and a yield is able to be further increased or prevented.

Table 1 below shows results of a heat cycle test in which the thickness of the wiring electrode 6a is changed from about 1.5 μm to about 4.0 μm. In the heat cycle test, a cycle test of about −55° C. to about 125° C. was performed in compliance with JESD47J-01 of JEDEC, and the number of cycles is the number expressing how many times wiring electrode can survive through a heat cycle test.

TABLE 1

| THICKNESS OF WIRING ELECTRODE 6a (μm) | THE NUMBER OF FAILED CYCLES | DETERMINATION OF THE NUMBER OF FAILED CYCLES |
|---|---|---|
| about 1.5 | about 350 to about 700 | good |
| about 2.0 | about 700 to about 850 | excellent |
| about 3.0 | about 1500 or more | excellent |
| about 4.0 | about 1500 or more | excellent |

As shown in Table 1, when the thickness of the wiring electrode 6a is about 2.0 μm to about 4.0 μm, it is confirmed that the number of failed cycles was larger than about 700 and that the occurrence of failure of the elastic wave device 1 is further reduced or prevented.

In addition, in the present preferred embodiment, a width W of the wiring electrode 6a illustrated in FIG. 3 is preferably equal to or more than about 6 μm, for example. In this case, the occurrence of failure, such as disconnection of the wiring electrode 6a, is further reduced or prevented. Although an upper limit of the width W of the wiring electrode 6a is not particularly limited, since a bump pad is usually about 100 μm, for example, an upper limit may preferably be set to about 120 μm, for example. Note that in FIG. 4A, the wiring electrode 6a extends from the region on the piezoelectric thin film 4 to the region R side. A direction perpendicular or substantially perpendicular to this direction and a thickness direction is defined as a width direction in which the width W of the wiring electrode 6a is provided.

In the present preferred embodiment, a height difference between T1 and T2 (T1-T2) illustrated in FIG. 4B is preferably equal to or less than about 4 μm, and more preferably equal to or less than about 1 μm, for example. Note that T1 is a distance between an upper surface 12d of the first insulating layer 12 in a region in which the multilayer film 3 is provided, and the first main surface 2a of the support substrate 2. Further, T2 is a distance between a lower surface 6a2 of the wiring electrode 6a located farther inside than a region in which the first insulating layer 12 is provided, and the first main surface 2a of the support substrate 2. By reducing the height difference between T1 and T2 (T1-T2), stress on the inner end 12c of the first insulating layer is able to be reduced or prevented, and the occurrence of failure due to disconnection of the wiring electrode 6a, for example, is able to be further reduced or prevented.

Figure 6:
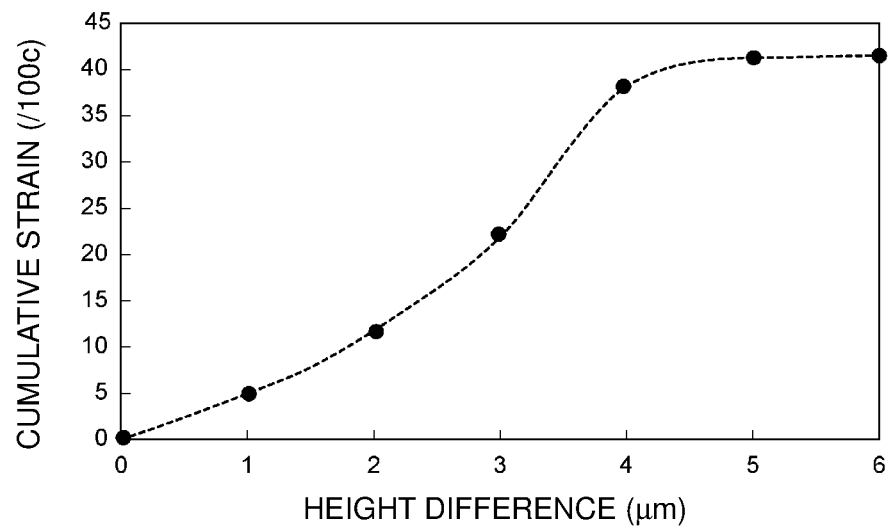
FIG. 6 is a graph illustrating relation between a height difference and cumulative strain.

FIG. 6 is a graph illustrating the relationship between a height difference between T1 and T2 (T1-T2) and cumulative strain. As illustrated in FIG. 6, when the height difference (T1-T2) is equal to or less than about 4 μm, it is understood that cumulative strain on the inner end 12c of the first insulating layer 12 is further reduced or prevented. Thus, stress on the inner end 12c of the first insulating layer 12 is able to be reduced or prevented, and it is possible to further reduce or prevent the occurrence of failure due to disconnection of the wiring electrode 6a, for example.

In the present preferred embodiment, a height difference between T1 and T3 (T1-T3) illustrated in FIG. 4B is preferably equal to or less than about 4 μm, and more preferably equal to or less than about 1 μm, for example. Note that T1 is the distance between an upper surface 12d of the first insulating layer 12 in a region where the multilayer film 3 is provided, and the first main surface 2a of the support substrate 2. Further, T3 is a thickness of the first insulating layer 12 in the region R in which the multilayer film 3 is not disposed. By reducing the height difference between T1 and T3 (T1-T3), stress on the inner end 12c of the first insulating layer 12 is able to be reduced or prevented, and the occurrence of failure due to disconnection of the wiring electrode 6a, for example, is able to be further reduced or prevented.

Second Preferred Embodiment

Figure 7A:
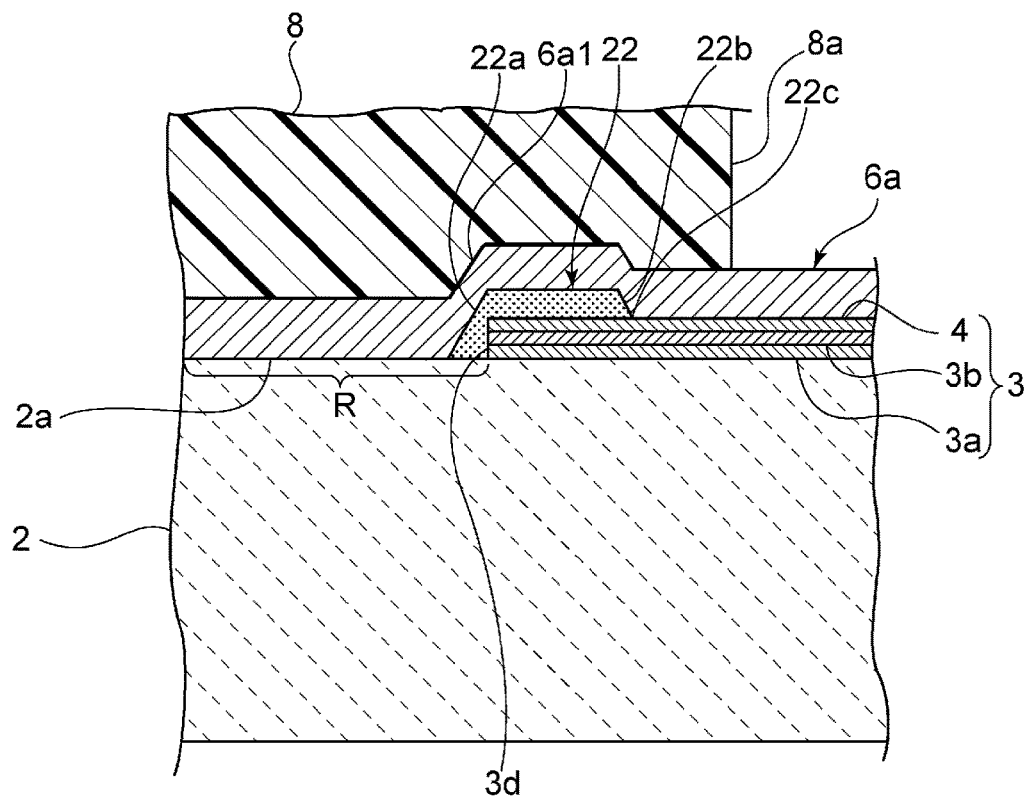
FIG. 7A is a partial cutaway enlarged sectional view for describing a main portion of an elastic wave device according to a second preferred embodiment of the present invention.
Figure 7B:
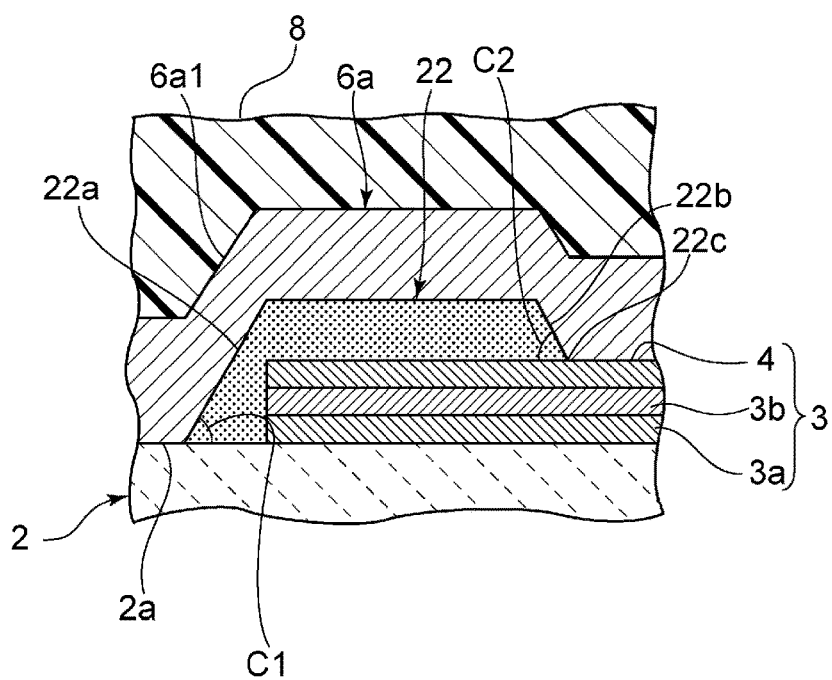
FIG. 7B is a partial cutaway sectional view further enlarging and illustrating a main portion in FIG. 7A.

FIG. 7A is a partial cutaway enlarged sectional view illustrating a main portion of an elastic wave device according to a second preferred embodiment of the present invention, and FIG. 7B is a partial cutaway sectional view further enlarging and illustrating the main portion. FIGS. 7A and 7B are sectional views of portions corresponding to FIGS. 4A and 4B for the first preferred embodiment, respectively.

In the elastic wave device according to the second preferred embodiment, a first insulating layer 22 extends from the region R on the first main surface 2a of the support substrate 2 to the piezoelectric thin film 4. However, the first insulating layer 12 in the elastic wave device of the first preferred embodiment extends outward in the region R. Compared to this, in the second preferred embodiment, one end of an inclined surface 22a of the first insulating layer 22 abuts against the first main surface 2a of the support substrate 2. That is, the first insulating layer 22 does not extend outside the inclined surface 22a. On the other hand, on the piezoelectric thin film 4, as in the first preferred embodiment, an inclined surface 22b extending to an upper surface of the piezoelectric thin film 4 is provided.

As illustrated in FIG. 7B, the angle C1 defined by the inclined surface 22a and the first main surface 2a, and the angle C2 defined by the second inclined surface 22b and the first main surface 2a are preferably equal to or less than about 80°, for example, as in the first preferred embodiment.

Note that, the angle C1 defined by the inclined surface 22a and the first main surface 2a, and the angle C2 defined by the inclined surface 22b and the first main surface 2a are more preferably equal to or less than about 60°, and still more preferably equal to or less than about 45°, for example.

In this manner, the first insulating layer 22 may end at the inclined surface 22a extending from a portion located above the piezoelectric thin film 4 toward the region R side. Also in this case, since the support layer 8 includes a portion extending from the region R to a region above an inner end 22c of the first insulating layer 22 located on the piezoelectric thin film 4, on the wiring electrode 6a, the occurrence of a tensile stress is reduced or prevented, and disconnection of the wiring electrode 6a is further reduced or prevented. Thus, even under severe conditions, such as repetition of a cycle from a low temperature to a high temperature, the occurrence of failure is reduced or prevented, and reliability is able to be further improved.

Third Preferred Embodiment

Figure 8:
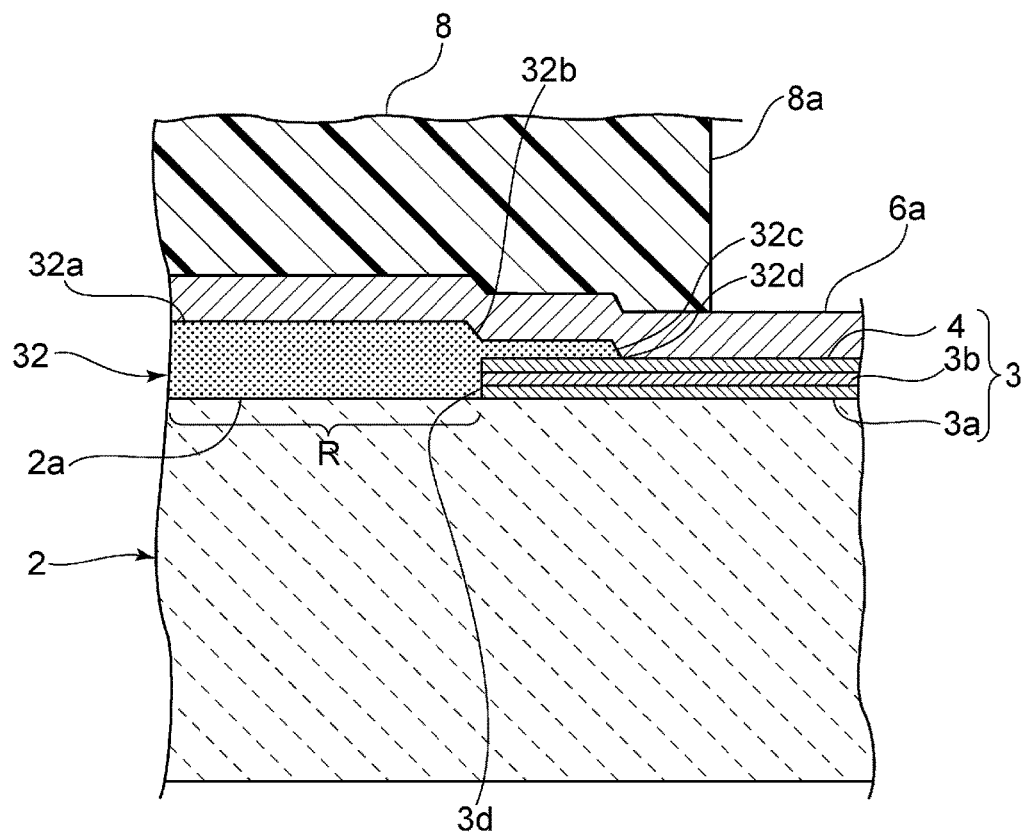
FIG. 8 is a partial cutaway enlarged sectional view illustrating a main portion of an elastic wave device according to a third preferred embodiment of the present invention.

FIG. 8 is a partial cutaway sectional view illustrating a main portion of an elastic wave device according to a third preferred embodiment of the present invention. FIG. 8 is a sectional view of a portion corresponding to FIG. 4A for the first preferred embodiment.

In the third preferred embodiment, an upper surface 32a of a first insulating layer 32 is higher than the piezoelectric thin film 4 in the region R. In other words, a thickness of the first insulating layer 32 in the region R is larger than a total of the thickness of the multilayer film 3 and the thickness of the first insulating layer 32 on the piezoelectric thin film 4. Thus, a step due to the above difference in thickness is provided on a surface of the first insulating layer 32 on an opposite side to the first main surface 2a. In the present preferred embodiment, the step portion is defined by an inclined surface 32b.

The inclined surface 32b is inclined so as to approach the first main surface 2a of the support substrate 2, as a distance from above the region R toward a side of the piezoelectric thin film 4 increases. In other words, as a distance from the side of the piezoelectric thin film 4 toward the region R side increases, the inclined surface 32b inclines in a direction away from the first main surface 2a. An angle defined by the inclined surface 32b and the first main surface 2a is also preferably equal to or less than about 80°, for example, as in the angle C1 in the first preferred embodiment and the second preferred embodiment.

Further, on the piezoelectric thin film 4, the first insulating layer 32 includes an inclined surface 32c as in the first preferred embodiment and the second preferred embodiment. An angle defined by the inclined surface 32c and the first main surface 2a is also preferably equal to or less than about 80°, for example. Accordingly, the occurrence of disconnection on the inclined surfaces 32b and 32c of the wiring electrode 6a is further reduced or prevented.

As in the elastic wave device of the third preferred embodiment, the upper surface 32a of the first insulating layer 32 may be relatively high in the region R.

The elastic wave device of the third preferred embodiment is different from those of the first preferred embodiment and the second preferred embodiment in the first insulating layer 32, the thickness distribution of the above first insulating layer 32, a direction of the inclined surface 32b, and a direction of an inclined surface in the wiring electrode 6a, but the remaining configuration is similar to that of the first and second preferred embodiments.

Accordingly, also in the elastic wave device of the third preferred embodiment, the support layer 8 includes, on the wiring electrode 6a, a portion extending from the region R to a region above an inner end 32d of the first insulating layer 32 located on the piezoelectric thin film 4. Thus, the occurrence of a tensile stress is reduced or prevented, and the occurrence of breakage of the wiring electrode 6a is reduced or prevented. Thus, even under severe conditions, such as repetition of a cycle from a low temperature to a high temperature, the occurrence of failure is reduced or prevented, and reliability is able to be further improved.

Fourth Preferred Embodiment

Figure 9:
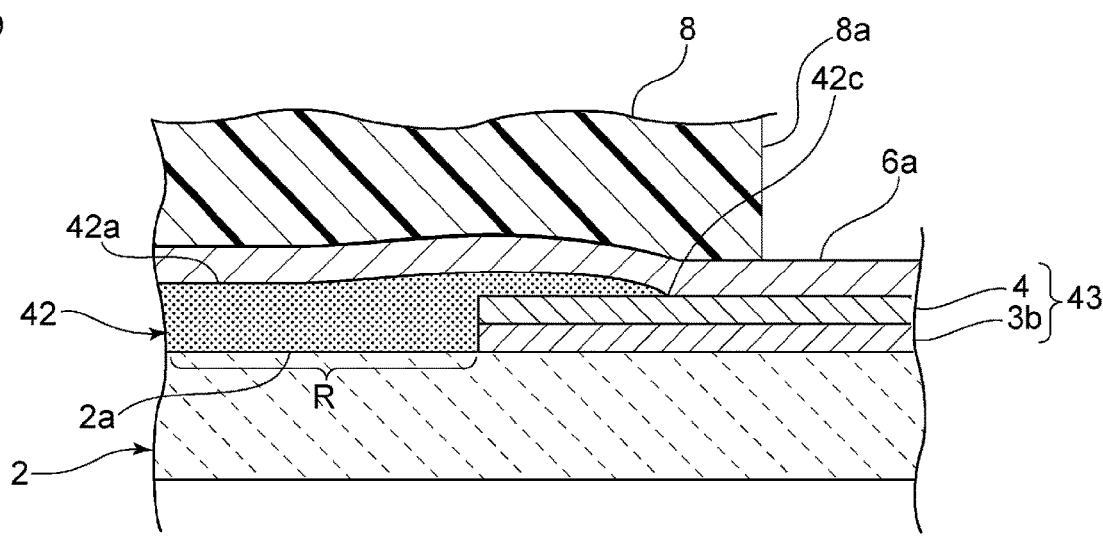
FIG. 9 is a partial cutaway enlarged sectional view illustrating a main portion of an elastic wave device according to a fourth preferred embodiment of the present invention.

FIG. 9 is a partial cutaway sectional view illustrating a main portion of an elastic wave device according to a fourth preferred embodiment of the present invention. FIG. 9 is a sectional view of a portion corresponding to FIG. 4A for the first preferred embodiment.

Also in the fourth preferred embodiment, an upper surface 42a of a first insulating layer 42 is higher than the piezoelectric thin film 4 in the region R. In other words, a thickness of the first insulating layer 42 in the region R is less than a total of the thickness of the multilayer film 3 and the thickness of the first insulating layer 42 on the piezoelectric thin film 4. The upper surface 42a of the first insulating layer 42 is gently inclined so as to approach the first main surface 2a of the support substrate 2, as a distance from above the region R toward a side of the piezoelectric thin film 4 increases. On the piezoelectric thin film 4, the first insulating layer 42 preferably has a rounded shape.

As in the elastic wave device of the fourth preferred embodiment, the upper surface 42a of the first insulating layer 42 may be relatively low in the region R.

In addition, in the fourth preferred embodiment, a multilayer film 43 includes the low acoustic velocity film 3b and the piezoelectric thin film 4. As in the multilayer film 43, a high acoustic velocity film is not necessarily provided.

The elastic wave device of the fourth preferred embodiment is different from those of the first preferred embodiment and the second preferred embodiment in the first insulating layer 42, the thickness distribution of the first insulating layer 42, a direction of an inclined surface in the wiring electrode 6a, and a configuration of the multilayer film 43, but the remaining configuration is similar to that of the first and second preferred embodiments.

Accordingly, also in the elastic wave device of the fourth preferred embodiment, the support layer 8 includes, on the wiring electrode 6a, a portion extending from the region R to a region above an inner end 42c of the first insulating layer 42 located on the piezoelectric thin film 4. Thus, the occurrence of a tensile stress is reduced or prevented, and the occurrence of breakage of the wiring electrode 6a is further reduced or prevented. Thus, even under severe conditions, such as repetition of a cycle from a low temperature to a high temperature, the occurrence of failure is reduced or prevented, and reliability is able to be further improved.

Fifth and Sixth Preferred Embodiments

Figure 10:
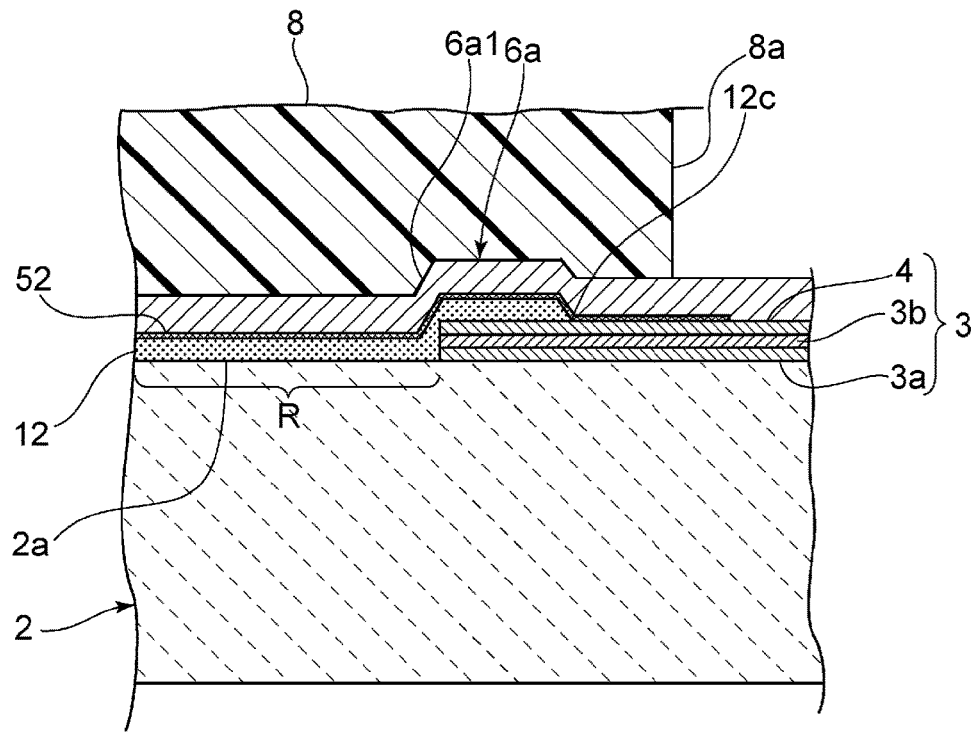
FIG. 10 is a partial cutaway enlarged sectional view illustrating a main portion of an elastic wave device according to a fifth preferred embodiment of the present invention.

FIG. 10 is a partial cutaway enlarged sectional view illustrating a main portion of an elastic wave device according to a fifth preferred embodiment of the present invention. FIG. 10 is a sectional view of a portion corresponding to FIG. 4A for the first preferred embodiment.

In the elastic wave device according to the fifth preferred embodiment, a second insulating layer 52 is laminated so as to cover the first insulating layer 12. The second insulating layer 52 is made of an insulating material different from that of the first insulating layer 12. The second insulating layer 52 is preferably made of an inorganic insulating material. Examples of such an inorganic insulating material include silicon oxide, silicon nitride, silicon oxynitride, and other suitable material.

The second insulating layer 52 made of an inorganic insulating material is provided, and the wiring electrode 6a is provided on the second insulating layer 52. Thus, adhesion between the wiring electrode 6a and the second insulating layer 52 is able to be improved. Thus, by using a synthetic resin as the first insulating layer 12 and the above-described inorganic insulating material as the second insulating layer 52, the occurrence of peeling in the above-described electrode land portion is further reduced or prevented. As described above, at the electrode land portion to which the under-bump metal layer and the metal bump are bonded, a large stress is applied to the electrode land portion of the wiring electrode 6a when the metal bump is bonded. In this case, there is a possibility that the electrode land is peeled off due to the stress. However, by providing the second insulating layer 52 as described above, it is possible to effectively reduce or prevent the above-described peeling.

Figure 11:
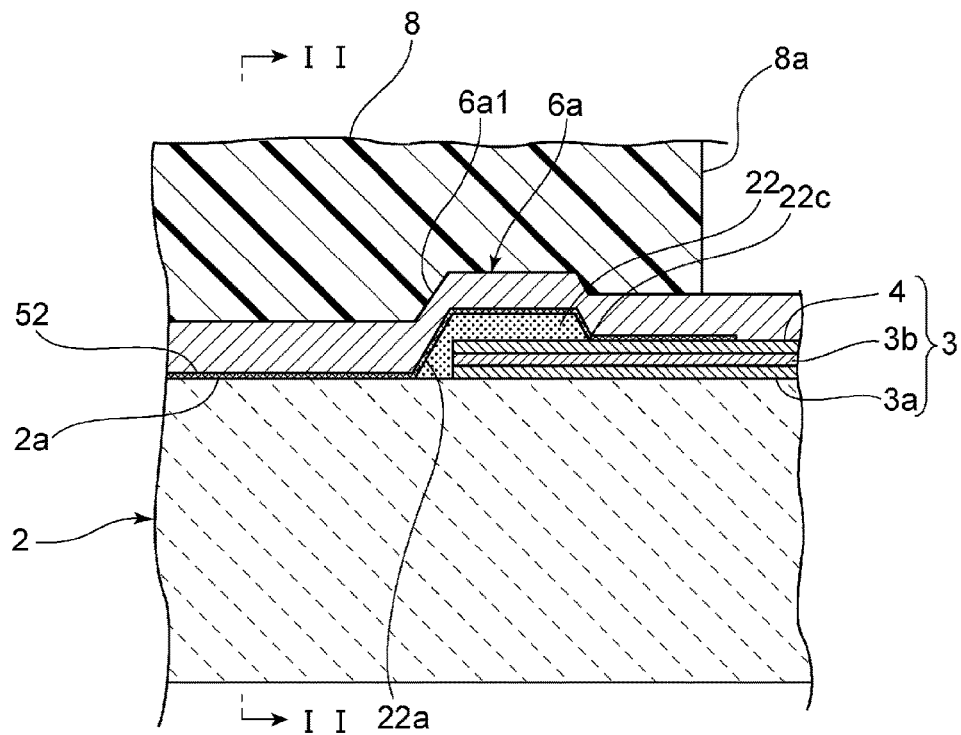
FIG. 11 is a partial cutaway enlarged sectional view illustrating a main portion of an elastic wave device according to a sixth preferred embodiment of the present invention.

FIG. 11 is a partial cutaway enlarged sectional view illustrating a main portion of an elastic wave device according to a sixth preferred embodiment of the present invention. FIG. 11 is a sectional view of a portion corresponding to FIG. 4A for the first preferred embodiment.

In the sixth preferred embodiment as well, the second insulating layer 52 is provided as in the fifth preferred embodiment. In the sixth preferred embodiment, as in the elastic wave device according to the second preferred embodiment, a lower end of the inclined surface 22a abuts against the first main surface 2a on the region R. Accordingly, the second insulating layer 52 covers the first insulating layer 22, and is further provided on the region R so as to extend to a region outside the first insulating layer 22. Preferably, as illustrated in FIG. 11, the second insulating layer 52 extends over an entire or substantially an entire region on which the wiring electrode 6a is disposed outside the piezoelectric thin film 4 and the first insulating layer 22. This makes it possible to more effectively reduce or prevent peeling of the wiring electrode 6a in the electrode land portion.

Since the respective elastic wave devices according to the fifth preferred embodiment and the sixth preferred embodiment are the same or substantially the same as those of the first and second preferred embodiments except that the second insulating layer 52 is provided, the same or substantially the same advantageous operational effects as those of the first and second preferred embodiments are able to be obtained.

Figure 12:
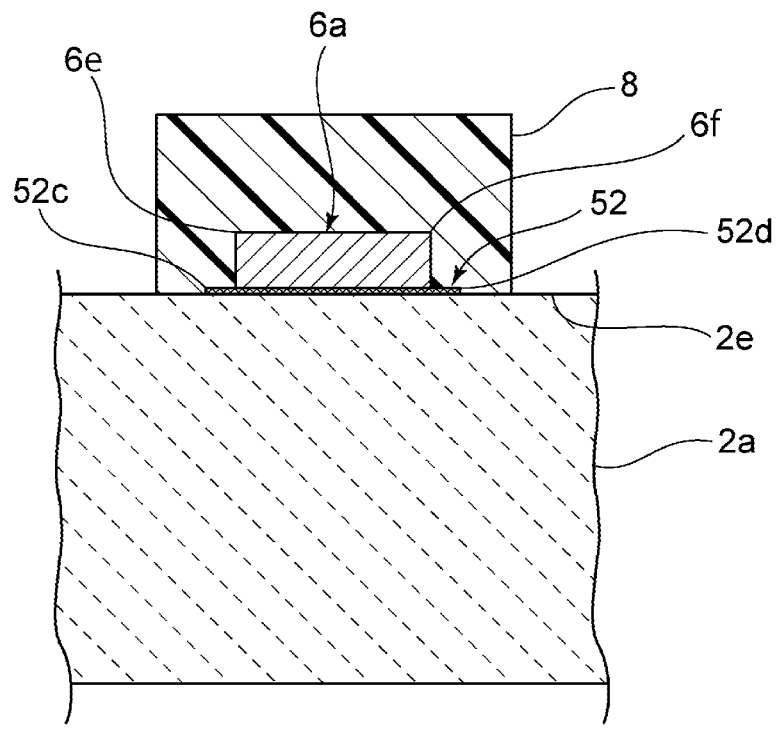
FIG. 12 is a sectional view of a main portion of a portion along a line II-II in FIG. 11.

FIG. 12 is a sectional view of a portion corresponding to a portion along the line II-II of FIG. 11. In FIG. 11, the wiring electrode 6a extends from a region above the piezoelectric thin film 4 to the region R side. A direction perpendicular or substantially perpendicular to this direction is defined as a width direction. FIG. 12 illustrates a section along this width direction.

As illustrated in FIG. 12, it is preferable that one end 6e in the width direction and another end 6f in the width direction of the wiring electrode 6a are located inside in the width direction in comparison with one end 52c in the width direction and another end 52d in the width direction of the second insulating layer 52. This makes it possible to reduce or prevent a leakage current between the wiring electrode 6a and the support substrate 2.

Seventh Preferred Embodiment

Figure 13:
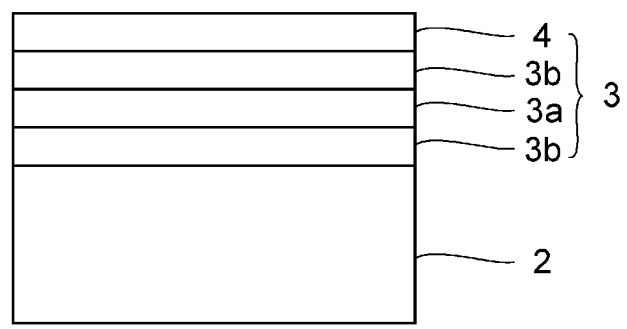
FIG. 13 is a front view illustrating a multilayer film used in a seventh preferred embodiment of the present invention.

FIG. 13 is a front view of a multilayer film used in an elastic wave device according to a seventh preferred embodiment of the present invention. In the seventh preferred embodiment, on the support substrate 2, the low acoustic velocity film 3b, the high acoustic velocity film 3a, the low acoustic velocity film 3b, and the piezoelectric thin film 4 are laminated in this order from a side of the support substrate 2. Thus, energy of an elastic wave to be used is able to be more effectively sealed by a portion on which the piezoelectric thin film 4 and the low acoustic velocity film 3b are laminated. In addition, it is possible to leak a higher mode to be a spurious response to the side of the support substrate 2 of the high acoustic velocity film 3a, and it is possible to reduce or prevent a spurious response of a higher mode. Thus, it is possible to obtain good resonance characteristics, a filter characteristic, and other advantageous characteristics due to an elastic wave to be utilized, and further, it is possible to reduce or prevent an undesired response due to a higher mode. As described above, a plurality of high acoustic velocity films and a plurality of low acoustic velocity films may be laminated in the multilayer film 3. Further, the multilayer film 3 may include a film other than the piezoelectric thin film 4, the high acoustic velocity film 3a, and the low acoustic velocity film 3b, for example, a dielectric film or other suitable film. Other points are the same or substantially the same as those of the first preferred embodiment. Thus, the same or substantially the same advantageous effects as in the first preferred embodiment are able to be obtained.

Eighth Preferred Embodiment

Figure 14:
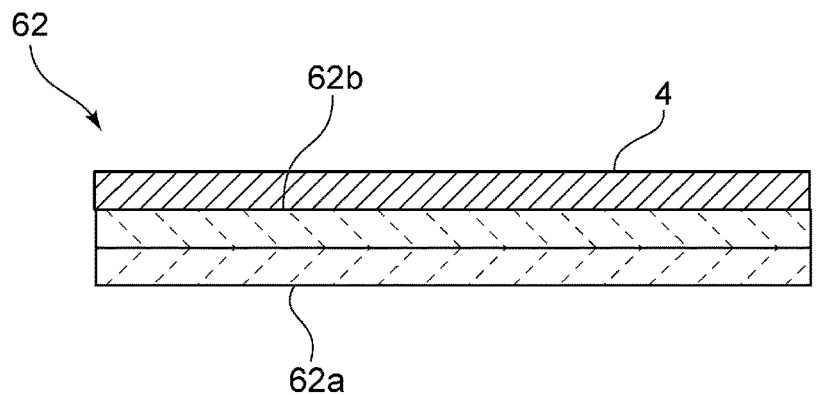
FIG. 14 is a front sectional view illustrating a multilayer film used in an eighth preferred embodiment of the present invention.

FIG. 14 is a front sectional view of a multilayer film used in an elastic wave device according to an eighth preferred embodiment of the present invention. In the eighth preferred embodiment, a multilayer film 62 includes a low acoustic impedance film 62b having a relatively low acoustic impedance that is laminated on a high acoustic impedance film 62a having a relatively high acoustic impedance. The piezoelectric thin film 4 is laminated on the above-described low acoustic impedance film 62b. Instead of the multilayer film 3, the multilayer film 62 may be used. As described above, in the present preferred embodiment, the multilayer film is not limited to one including the high acoustic velocity film and the low acoustic velocity film described above, and may have a structure in which a high acoustic impedance film and a low acoustic impedance film are laminated.

In addition, in preferred embodiments of the present invention, there is no particular limitation on a configuration of a multilayer film including a piezoelectric thin film.

Accordingly, a multilayer film may include a plurality of dielectric films that are laminated to improve temperature characteristics.

Other points are the same or substantially the same as those of the first preferred embodiment. Thus, the same or substantially the same advantageous effect as in the first preferred embodiment can be obtained.

Ninth Preferred Embodiment

Figure 15:
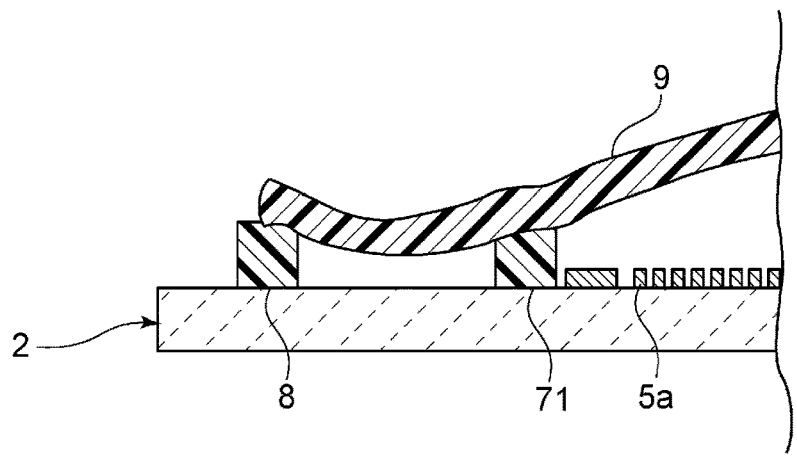
FIG. 15 is a schematic sectional view illustrating an elastic wave device according to a ninth preferred embodiment of the present invention.

FIG. 15 is a schematic sectional view illustrating an elastic wave device according to a ninth preferred embodiment of the present invention. In FIG. 15, the multilayer film 3, the wiring electrodes 6a to 6d, the first insulating layer 12, the metal bumps 11a and 11b, and the under-bump metal layers 10a and 10b, for example, are not illustrated.

Figure 16:
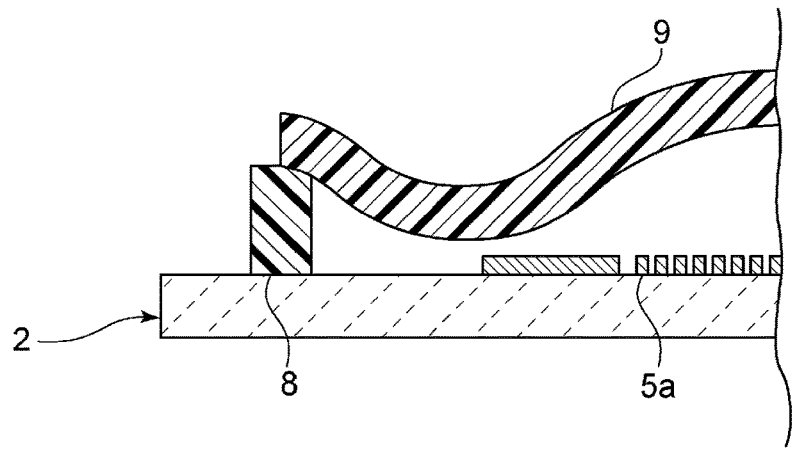
FIG. 16 is a schematic sectional view illustrating an example of an elastic wave device in which a cover member is supported only by a first support layer.

As illustrated in FIG. 15, in the elastic wave device according to the ninth preferred embodiment, a second support layer 71 is provided on an inner side of the support layer 8, that is, on a side of the IDT electrode 5a, when the support layer 8 is used as a first support layer. As in the present preferred embodiment, when the distance between the support layer 8 and the IDT electrode 5a is large, the second support layer 71 may be provided inside the support layer 8. In particular, when the cover member 9 is made of a photosensitive resin, such as a photosensitive polyimide resin, for example, the cover member 9 may droop toward a side of the IDT electrode 5a during baking after exposure. Thus, as illustrated in FIG. 16, when only the first support layer 8 is provided, it is necessary to increase height of the support layer 8, which may make it difficult to reduce the height.

On the other hand, in the elastic wave device according to the ninth preferred embodiment, since the second support layer is provided inside the support layer 8, the occurrence of drooping of the cover member 9 toward the side of the IDT electrode 5a due to baking after exposure is reduced. Thus, it is possible to further reduce the height.

In addition, there is no particular limitation on a location at which the second support layer 71 is provided, as long as the second support layer 71 is provided inside the support layer 8. As in the support layer 8, the second support layer 71 may have a frame shape, and may be partially provided along a side or a corner portion of the support substrate 2.

Figure 17:
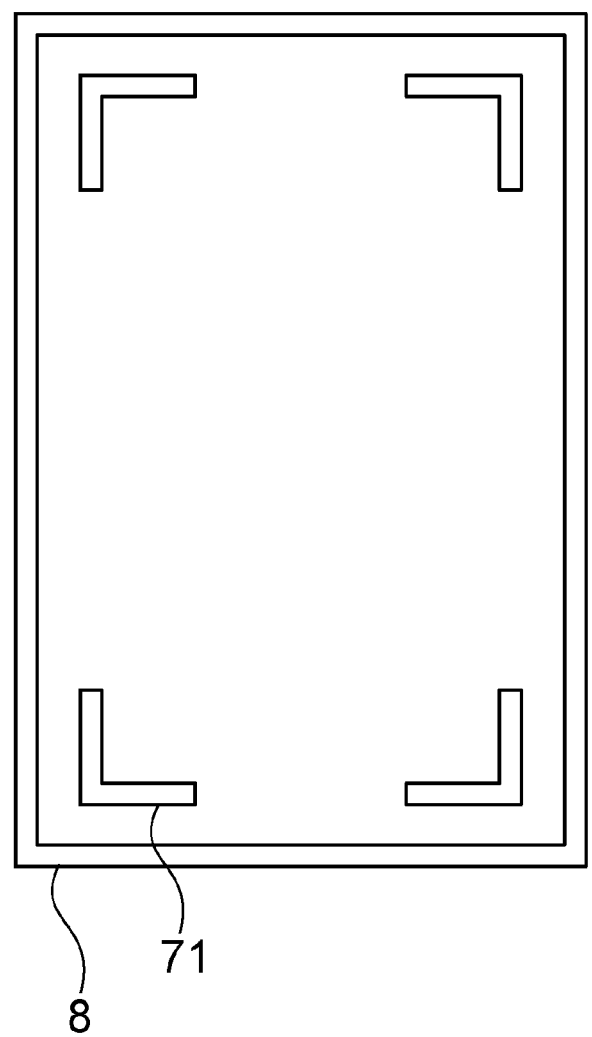
FIG. 17 is a schematic plan view illustrating a support layer portion of the elastic wave device according to the ninth preferred embodiment of the present invention.

However, as illustrated in a plan view in FIG. 17, the second support layer 71 is preferably provided along a corner portion of the support substrate 2. Since droop is more likely to occur due to baking after exposure particularly at a corner portion of the cover member 9, it is possible to further reduce the height by providing the second support layer 71 along the corner portion of the support substrate 2.

Figure 18:
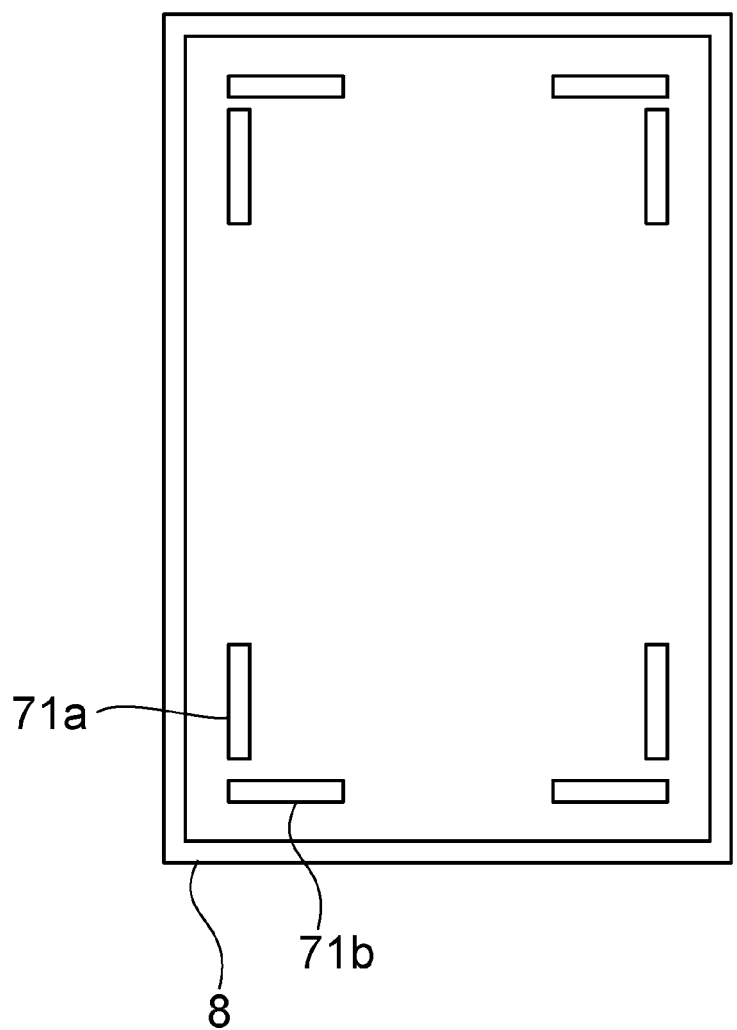
FIG. 18 is a schematic plan view illustrating a support layer portion of the elastic wave device according to the ninth preferred embodiment of the present invention.

Note that, as in a modified example illustrated in FIG. 18, the second support layer 71 may be divided into a first support layer portion 71a and a second support layer portion 71b, and provided at a corner portion of the support substrate 2, and a shape thereof is not particularly limited.

Since the elastic wave device according to the ninth preferred embodiment is similar to that of the first preferred embodiment, except that the second support layer 71 is provided, the same or substantially the same advantageous operational effects as in the first preferred embodiment are obtained.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device, comprising:
a support substrate;
a multilayer film provided on or above the support substrate and including a plurality of films including a piezoelectric thin film;
an IDT electrode provided on one surface of the piezoelectric thin film, the multilayer film is not disposed in a region outside a region in which the IDT electrode is provided, in plan view;
a first insulating layer extending from at least a portion of the region in which the multilayer film is not disposed to a region on the piezoelectric thin film;
a wiring electrode electrically connected to the IDT electrode, extending from a region on the piezoelectric thin film to a region on the first insulating layer, and extending to a region on a portion of the first insulating layer located in the region in which the multilayer film is not disposed; and
a support layer provided on or above the support substrate and including a cavity to define a hollow space; wherein
the support layer includes a portion extending from the region in which the multilayer film is not disposed, to a region above an inner end of the first insulating layer located on the piezoelectric thin film, on the wiring electrode.

2. The elastic wave device according to claim 1, wherein the support layer includes a portion on the wiring electrode, extending from the region in which the multilayer film is not disposed to, a farther inner side than the inner end of the first insulating layer located on the piezoelectric thin film.

3. The elastic wave device according to claim 1, wherein the first insulating layer extends from at least a portion of the region in which the multilayer film is not disposed, to a region on the piezoelectric thin film, passing through a side surface of the multilayer film.

4. The elastic wave device according to claim 1, wherein an opposite surface of the first insulating layer to a surface on a side of the support substrate includes a first inclined surface inclined such that a distance from the side of the support substrate increases, as a distance increases from the region in which the multilayer film is not disposed toward the region on the piezoelectric thin film.

5. The elastic wave device according to claim 4, wherein the first inclined surface of the first insulating layer extends from a region on the support substrate to a region of the first insulating layer on the piezoelectric thin film.

6. The elastic wave device according to claim 4, wherein the first insulating layer extends from the first inclined surface to at least a portion of the region in which the multilayer film is not disposed.

7. The elastic wave device according to claim 1, wherein a thickness of the first insulating layer in the region in which the multilayer film is not disposed is larger than a thickness of the first insulating layer on the piezoelectric thin film.

8. The elastic wave device according to claim 7, wherein an opposite surface of the first insulating layer to a surface on a side of the support substrate includes a second inclined surface inclined such that a distance to the side of the support substrate decreases, as a distance increases from the region in which the multilayer film is not disposed toward the region on the piezoelectric thin film.

9. The elastic wave device according to claim 1, further comprising:
a second insulating layer provided between the wiring electrode and the support substrate; wherein
the second insulating layer extends to a region on the first insulating layer.

10. The elastic wave device according to claim 9, wherein when a direction perpendicular or substantially perpendicular to a direction in which the wiring electrode extends is a width direction, one end and another end of the wiring electrode in the width direction are respectively located, in the width direction, inside one end and another end of the second insulating layer in the width direction.

11. The elastic wave device according to claim 1, wherein the multilayer film includes the piezoelectric thin film and a low acoustic velocity film in which an acoustic velocity of a propagating bulk wave is lower than an acoustic velocity of an elastic wave propagating in the piezoelectric thin film, and the piezoelectric thin film is laminated on the low acoustic velocity film.

12. The elastic wave device according to claim 1, wherein the multilayer film includes the piezoelectric thin film, a high acoustic velocity film in which an acoustic velocity of a propagating bulk wave is higher than an acoustic velocity of an elastic wave propagating in the piezoelectric thin film, and a low acoustic velocity film laminated on the high acoustic velocity film, in which an acoustic velocity of a propagating bulk wave is lower than an acoustic velocity of an elastic wave propagating in the piezoelectric thin film, and the piezoelectric thin film is laminated on the low acoustic velocity film.

13. The elastic wave device according to claim 1, wherein the multilayer film includes the piezoelectric thin film, a high acoustic impedance film having a relatively high acoustic impedance, and a low acoustic impedance film having a lower acoustic impedance compared to the high acoustic impedance film.

14. The elastic wave device according to claim 1, wherein the piezoelectric thin film is made of $LiTaO_3$.

15. The elastic wave device according to claim 1, wherein a film thickness of the piezoelectric thin film is equal to or less than about $1.5\lambda$, where $\lambda$ is a wave length of an elastic wave determined by an electrode period of the IDT electrode.

16. The elastic wave device according to claim 1, further comprising a cover disposed on the support layer to seal the hollow space.

17. The elastic wave device according to claim 1, wherein the first insulating layer is made of a synthetic resin.

18. The elastic wave device according to claim 9, wherein the first insulating layer is made of a different material that the second insulating layer.

19. The elastic wave device according to claim 1, wherein a thickness of the wiring electrode is equal or more than about 2 μm.

20. The elastic wave device according to claim 19, wherein the thickness of the wiring electrode is less than about 5 μm.

* * * * *